United States Patent

Burman et al.

[15] 3,684,151

[45] Aug. 15, 1972

[54] SOLDER MACHINE

[72] Inventors: Per Aron Burman, Temple City; Sandor F. Goldschmied, Fullerton; Mahesh C. Sharma, Sierra Madre, all of Calif.

[73] Assignee: Burroughs Corporation, Detroit, Mich.

[22] Filed: Aug. 8, 1969

[21] Appl. No.: 848,453

[52] U.S. Cl.........................288/19, 228/33, 118/423

[51] Int. Cl...............................B23k 1/00, B23k 5/22

[58] Field of Search................228/19, 20, 33, 36, 37; 134/104, 130; 118/423, 428

[56] References Cited

UNITED STATES PATENTS

| | | | |
|---|---|---|---|
| 3,277,566 | 10/1966 | Christensen | 228/37 X |
| 3,210,182 | 10/1965 | Funari | 73/56 |
| 3,172,781 | 3/1965 | Grill | 228/36 X |
| 3,092,059 | 6/1963 | Tesch, Jr. | 228/37 |
| 2,771,049 | 11/1956 | Fish | 228/33 |
| 2,619,063 | 11/1952 | Anderson | 228/37 X |
| 2,344,589 | 3/1944 | Bogner | 228/33 |
| 2,370,775 | 3/1965 | Capita | 228/33 X |

*Primary Examiner*—John F. Campbell
*Assistant Examiner*—R. J. Craig
*Attorney*—Christie, Parker & Hale

[57] ABSTRACT

A soldering machine particularly useful for removing integrated circuit components for printed circuit boards is described. The apparatus includes a substantially closed bath of molten solder and a short passage leading upwardly from the closed chamber and having an open upper end. A printed circuit board holder and positioning frame is positioned over the open end of the passage as guided by a template so that a circuit element such as an integrated circuit package has its soldered leads positioned over the opening. When so positioned a plunger displaces a portion of solder in the closed chamber and the molten solder level in the passage rises to contact the leads to be soldered. Such a machine has particular utility for heating leads of a single component on a printed circuit board for removing the component from the board.

10 Claims, 3 Drawing Figures

INVENTORS.
PER ARON BURMAN
SANDOR F. GOLDSCHMIED
BY MAHESH C. SHARMA

Christie, Parker & Hale
ATTORNEYS

SOLDER MACHINE

BACKGROUND

This invention is in the field of solder machines for printed circuit boards and, particularly, machines for soldering or removing individual components from a board.

The machine described herein is particularly useful in conjunction with a hand tool described and claimed in copending U.S. Patent Application Ser. No. 848,545 entitled "Component Removal Tool" by P. A. Burman, now U.S. Pat. No. 3,579,795 although other component removing tools may be employed if desired.

A substantial problem in printed circuit boards is the removal of components therefrom. If a board is damaged or obsolete, it may be desirable to remove components for salvage, or if a component fails or is found unsatisfactory, it may be desired to remove an individual component. The problem becomes particularly acute with the advent of integrated circuit components which actually include many circuit elements in an individual package and the individual packages form the components soldered to the printed circuit board. The problem is compounded in such situations since the integrated circuit package usually has many leads which must all be heated at once.

In one type of integrated circuit component that is widely used, fourteen leads in two rows of seven each are inserted through plated-through holes on a printed circuit board. These fourteen leads protrude a short distance through the opposite side of a board from the component and are clinched over at a small angle and then soldered to conductors on the printed circuit board for completing an electrical circuit and providing mechanical strength. In other integrated circuit components, greater numbers and other arrangements of leads are provided for soldering through printed circuit boards in substantially the same manner.

In order to remove or replace an integrated circuit component, all of the leads must be simultaneously heated, which has been done with a soldering iron in the past. All of the clinched leads must be straightened while the solder is molten. An extractor tool, pliers or the like can then be used for pulling the component away from the printed circuit board while the solder is molten.

This technique of component removal presents significant problems. Heating of all of the integrated circuit component leads at the same time, and maintaining the solder molten for removing the component, is quite difficult, if not impossible when a large number of leads are involved. The prior technique often lead to overheating of the component or the printed circuit board, requiring the scrapping of damaged parts. On the other hand, if insufficient heat was applied to the leads, the component was often broken or the plated circuit was pulled away from the printed circuit board. It, therefore, becomes highly desirable to provide a means for simultaneously heating all of the multiple leads of an integrated circuit component on a printed circuit board, and maintaining the temperature in a selected range to permit component removal.

BRIEF SUMMARY OF THE INVENTION

Thus, in the practice of this invention according to a preferred embodiment, there is provided a solder machine having a substantially closed chamber for molten solder with an upwardly facing aperture. Means are provided for positioning a printed circuit board or other work piece over the aperture and means are provided for displacing solder in the closed chamber to force it into the aperture for contacting the work piece.

In particular, in a preferred embodiment a pneumatically actuated plunger is provided to displace molten solder in the closed chamber to raise the liquid solder level in a short conduit extending upwardly from the closed chamber. A circuit board holding and positioning frame is guided by a template for precisely positioning a printed circuit board over the aperture. Means are provided for actuating the pneumatic plunger when the circuit board is in the proper position.

DRAWINGS

Objects and many of the attendant advantages of this invention will be appreciated as the same becomes understood by reference to the following detailed description when considered in connection with the accompanying drawings wherein.

Throughout the drawings like reference numerals refer to like parts.

DESCRIPTION

Figure 1:
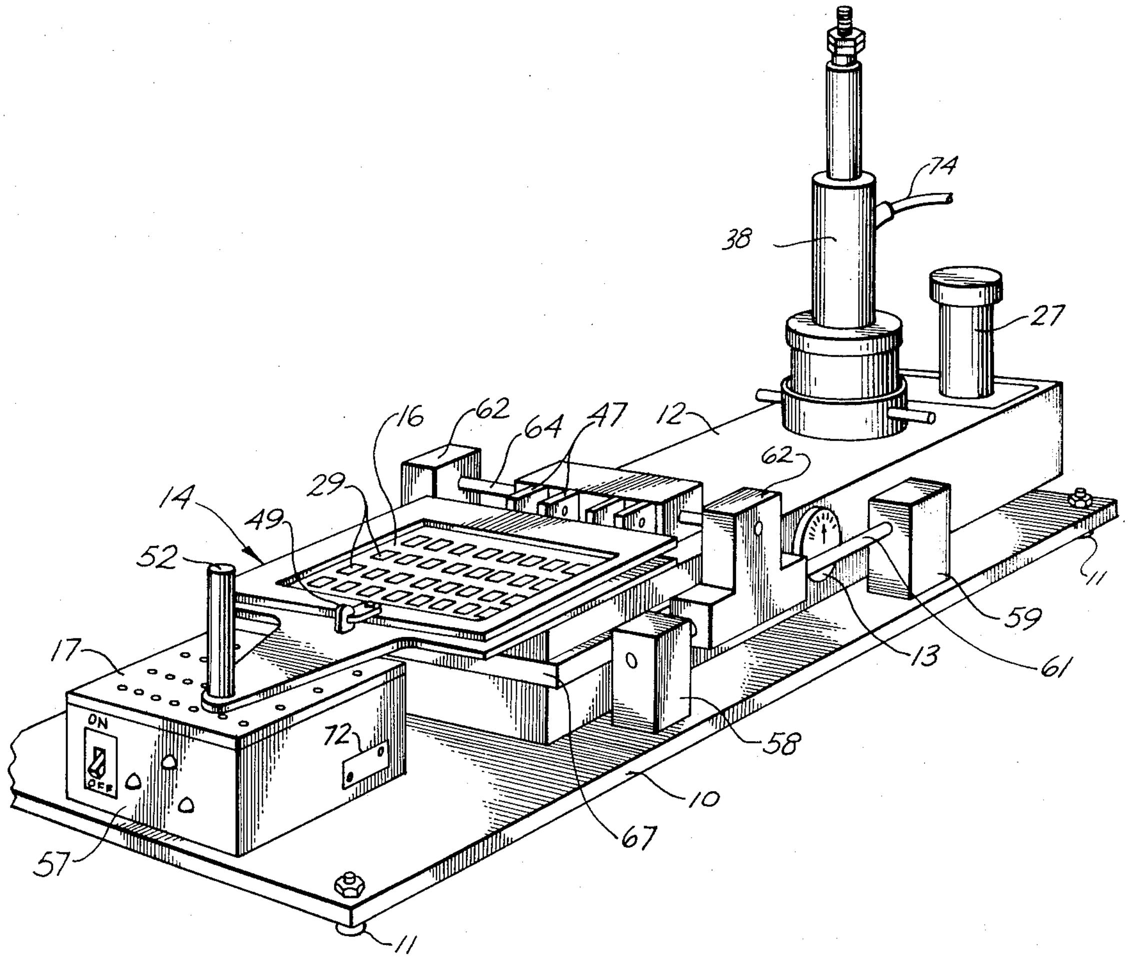
FIG. 1 illustrates in perspective a solder machine constructed according to the principles of this invention.

FIG. 1 illustrates in perspective a solder machine constructed according to the principles of this invention. As illustrated in this embodiment, there is provided a base 10 for the entire machine, and conventional leveling feet 11 are provided at the corners for adjusting the machine to remain level in operation. A solder pot 12 is provided on the base at one end of the apparatus and preferably a temperature gauge 13 is provided on the solder pot for indicating the temperature of solder therein. A printed circuit board clamp 14 holds a printed circuit board 16 over a portion of the solder pot 12 as hereinafter described in greater detail. The position of the printed circuit board clamp is determined by a template 17 at the opposite end of the machine from the solder pot 12.

Figure 2:
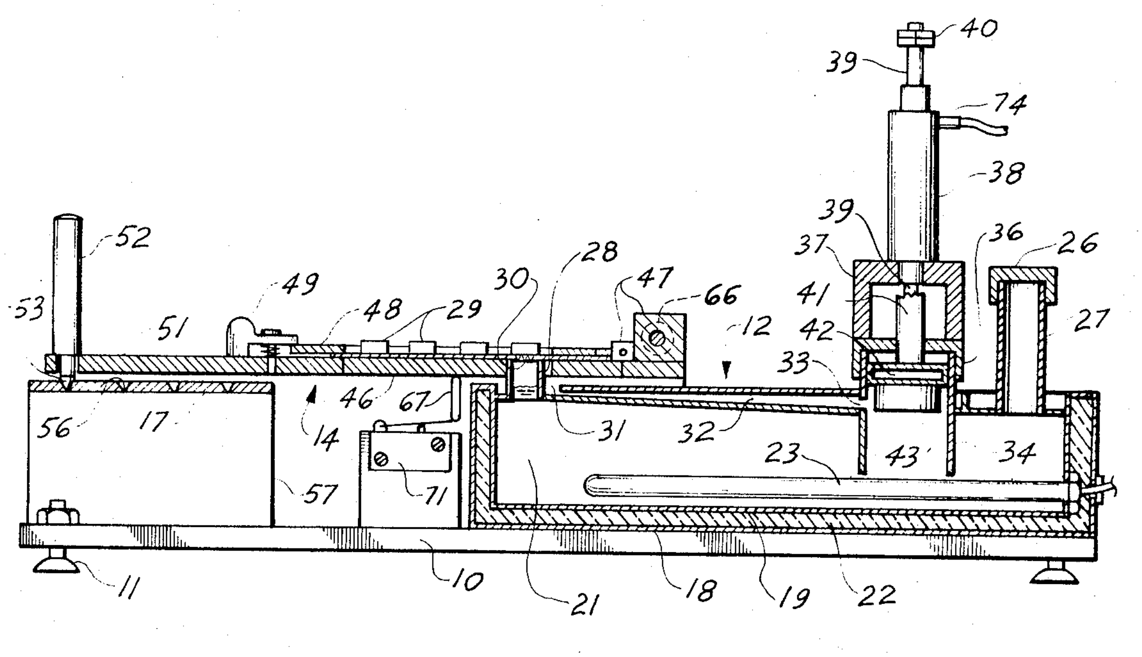
FIG. 2 is a cross section along the length of the machine.

Details of the solder pot and structure associated therewith can be seen in greater detail in the cross section of FIG. 2. Thus, the solder pot is made in the form of an outer housing 18 attached to the base 10, and an inner housing 19 for containing molten solder 21. Thermal insulation 22 is provided between the outer and inner housings 18 and 19, respectively, for minimizing heat losses and maintaining the rest of the apparatus at an acceptable temperature. One of more conventional electric immersion heaters 23 protrude into the solder for heating. A conventional temperature control sensor 24 (FIG. 3) is also provided in the solder bath. When the solder level is depleted in the bath, additional solder may be introduced by removing a cap 26 from an inlet tube 27 and adding additional molten solder or stick solder which is quickly melted in the bath.

A short rectangular conduit 28, having an open upper end, is provided leading from the interior of the solder pot, and the surface of the molten solder is normally maintained in or very near this conduit as illustrated in FIG. 2. The printed circuit board 16, having integrated circuit components 29 thereon, is positioned so that solder leads 30 from at least one of the components are positioned over the open upper end of the conduit 28 in a manner hereinafter described in greater detail. In the course of operating the soldering machine, solder may be caused to flow out of the open end of the conduit and, therefore, an open catch basin or moat 31 is provided around the conduit 28 for collecting any overflow solder. A trough 32 slopes slightly downwardly from the catch basin 31 so that any molten solder can flow back into the solder pot by way of an orifice 33.

In order to cause the molten solder 21 to rise in the conduit 28, means are provided for displacing a portion of the solder in the substantially closed inner housing 19. Thus, there is provided an open cylinder 34 secured to the inner housing 19 and extending a substantial distance below the surface of the molten solder, and also a substantial distance above and out of the solder bath. A cap 36 is detachably fastened to the cylinder 34 by a short turn of thread, lugs or the like (not shown). A housing 37 on the cap supports a conventional pneumatic actuator 38 having a longitudinally movable shaft 39 extending therethrough. A piston 41 is connected to the shaft 39 and extends through, and is guided by, an aperture through the cap 36 on the cylinder 34 extending upwardly above the solder bath. Attached to the piston 41 is a float chamber 42. The float chamber 42 is hollow so as to be buoyant in the molten solder. A solder displacing body 43 is connected to and below the float 42.

A pair of nuts 40 are jammed together on a threaded portion of the shaft 39 for adjustably limiting the length of stroke of the pneumatic actuator.

The printed circuit board clamp 14 has a lower platen 46 having a rectangular opening over which the printed circuit board 16 is placed for operation of the apparatus. A pair of alignment pins 45 (FIG. 3) mate with holes in the printed circuit board for proper positioning. A pair of hinges 47 on the lower platen serves to mount a board holding plate 48 so that the holding plate can be raised to insert a printed circuit board onto the pins 45, and thereafter brought down to hold the printed circuit board 16 in place. The board holding plate also has a rectangular opening for accommodating the board. A swing clamp or latch 49 on the lower platen is employed to hold the cover plate in tight engagement with the printed circuit board.

An extending tongue 51 on the lower platen supports a locating and operating handle 52 for the machine operator. A conical projecting point 53 extends below the handle on the lower side of the tongue 51 on the lower plate 46. A replaceable template 17, having a plurality of conical indentations 56, is positioned above the base on a control housing 57 so as to be engageable by the point 53 extending from the lower platen. If desired, holes or other indicia engageable by a member on the circuit board holder may be used in lieu of conical depressions 56.

The entire printed circuit board clamp 14 is mounted so as to be movable in two orthogonal directions and yet maintain orientation so that a selected integrated circuit component on the printed circuit board 16 is positioned over the open end of the conduit 28 when the point 53 engages an indentation 56 in the template 54.

Figure 3:
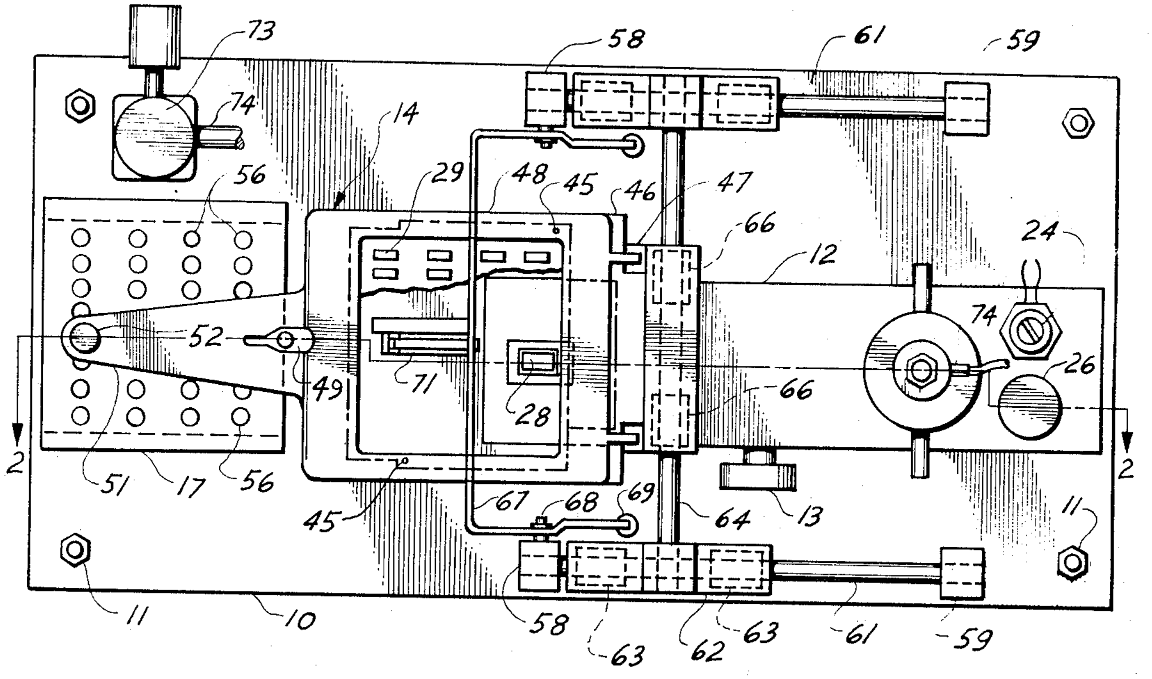
FIG. 3 is a plan view of the machine of FIG. 1.

In order to so mount the printed circuit board clamp 14 a pair of forward posts 58, as seen in FIGS. 1 & 3, are mounted on the base 10 at either side of the apparatus approximately straddling the open conduit 28. A pair of rearward posts 59 are also mounted on the base, and a slide bar 61 is provided between the forward and rearward posts 58 and 59 on each side of the apparatus to form a track running part way along the length of the apparatus.

A pair of T-shaped blocks 62 are each mounted on the slide bars 61 by way of bearings 63 so as to be free to slide longitudinally along the length of the slide bars 61. A transverse bar 64 interconnects and is rigidly secured to each of the T-shaped blocks 62. Thus, the rigid assembly of transverse bar 64 and blocks 62 is free to slide as a unitary carriage along the length of the apparatus on the two slide bars 61.

The lower platen 46 is mounted on the transverse bar 64 by a pair of bearings 66, which permit sliding motion of the circuit board clamp 14 transversely of the machine and also permit the clamp 14 to be raised and lowered by pivoting about the transverse bar 64. Thus, it will be apparent that the circuit board clamp 14 is free to move fore and aft on the machine by sliding along the bars 61, is free to move side to side on the machine by sliding along the bar 64, and is also free to be raised and lowered by pivoting about the bearings 66.

As is most clearly seen in FIG. 3, a U-shaped treadle 67 is mounted between the forward posts 58 by pivots 68 so that the bight of the "U" extends transversely of the machine beneath the printed circuit board clamp 14. Tension springs 69 between the ends of the U-shaped treadle 67 and the base 10 bias the bight of the treadle upwardly against the circuit board clamp. A normally open switch 71 is positioned below the bight of the treadle so as to be closed when the treadle is depressed. The switch 71 is electrically connected to a conventional time delay relay 72 which is, in turn, electrically connected to a conventional solenoid operated pneumatic valve 73. An air line 74 interconnects the solenoid operated pneumatic valve with the pneumatic actuator 38 which serves to displace solder in the solder bath and force it into the open ended conduit 28.

In order to operate the soldering machine, the immersion heaters 23 are turned on to melt the solder 21 in the inner housing 19 of the solder pot. Additional solder is added by way of the tube 27 as may be required to bring the level of liquid solder in the bath into or just below the open conduit 28. When the temperature of the solder has reached approximately 500° F., soldering or removal of soldered components can commence.

A printed circuit board 16 having a plurality of integrated circuit components 29 is placed on the lower platen 46 over the rectangular opening therein, and the board holding plate 48 is pivoted down on the hinges 47 to hold the printed circuit board in position. The board holding plate 48 is clamped to the lower platen by the latch or clamp 49. The operator then moves the handle 52 so that the point 53 on the tongue 51 of printed circuit board clamp engages an indentation 56 on the guide template 17 corresponding to a selected component to be soldered. As the operator moves the handle, the entire printed circuit board clamp 14 moves along the slide bars 61 and 64 so that the selected component is positioned exactly over the open ended conduit 28.

As the point 53 on the circuit board clamp 14 drops into an indentation 56, the clamp and, hence, printed circuit board 16, is lowered so that the soldered leads 30 on the integrated circuit component 29 are lowered slightly into the open ended conduit 28. The lowering of the clamp also depresses the treadle 67 to close the switch 71. This, in turn, activates the time delay relay 72 which opens the pneumatic valve 73, thereby applying air pressure to the pneumatic actuator 38. The time delay relay holds the pneumatic valve 73 open for a preset time found to be sufficient to heat the solder on the integrated circuit component leads. In one example, four seconds was found adequate. If desired, the desired time of solder heating can be manually controlled. At the end of this elapsed time, the relay permits the valve to close and deactivate the pneumatic actuator 38.

When air pressure is applied to the pneumatic actuator, its plunger 39 strokes downwardly to the extent permitted by the adjusting nuts 40. Stroking of the plunger 39 presses the float 42 and solder displacing body 43 into the substantially closed bath of molten solder 21 and thereby causes the molten solder level to rise to the top of the open ended conduit 28. Any excess solder in the conduit overflows the top and is collected in the moat or catch basin 31 and runs down the channel 32 to return to the solder pot. While the plunger on the pneumatic actuator is at its lowermost position, the float 42 in in front of the orifice 33 leading between the channel 32 and the solder pot so as to temporarily prevent the excess solder from returning to the pot, and also closing the orifice to prevent displaced solder from the solder pot from entering the channel 32 from the lower end instead of rising in the conduit 28.

When the molten solder rises in the conduit 28, it contacts the leads of the component 29 on the printed circuit board, thereby effecting soldering of the leads to the board or heating of the leads so that the component may be removed if desired. When the air pressure is removed from the pneumatic actuator, the plunger is caused to rise again by the buoyancy of the float 42 in the molten solder. The operator may then move the printed circuit board clamp 14 and circuit board 16 to a new position as guided by the template 54 for soldering or removal of another component.

It will be apparent that many modifications and variations can be made in apparatus constructed according to the principles of this invention. Other mounting arrangements can be employed for circuit board clamp or a direct mechanical or electrical actuators can be employed for displacing solder in the solder bath. A bellows instead of piston may be employed to displace solder. Similarly, in the illustrated embodiment a rectangular conduit 28 is employed for use with a particular integrated circuit component. Other geometries and sizes of open ended conduits may be envisioned. Similarly, a particular arrangement of components on a circuit board and matching template have been illustrated; however, many other variations in arrangement of components on a board and corresponding templates can be employed. Many other modifications and variations of the present invention will be apparent to one skilled in the art.

We claim:

1. A solder machine comprising:
a chamber for containing molten solder;
a conduit in fluid communication with the chamber and having an upwardly facing open end;
means for positioning a work piece to be contacted by molten solder over the open end of the passage;
means for displacing a portion of molten solder in the chamber, thereby causing molten solder to rise in the conduit for contacting the work piece; and
means for automatically actuating the means for displacing solder in response to a work piece being correctly positioned over the open end of the passage.

2. A solder machine comprising:
a chamber for containing molten solder;
a conduit in fluid communication with the chamber and having an upwardly facing open end;
means for positioning a work piece to be contacted by molten solder over the open end of the passage;
means for displacing a portion of molten solder in the chamber, thereby causing molten solder to rise in the conduit for contacting the work piece, comprising a buoyant piston movable into and out of the solder chamber, and means for moving the piston into the chamber; and wherein said means for positioning a work piece comprises:
a holder for a printed circuit board;
first guide means for guiding motion of the holder in one direction in a horizontal plane;
second guide means for guiding motion of the holder in a second direction in a horizontal plane; and
a template for positioning the holder in a preselected position on the first and second guide means.

3. A solder machine comprising:
a base;
a solder pot mounted on the base, the solder pot including an upwardly facing open aperture;
means for maintaining solder in the solder pot in a molten state;
a plunger defining at least a portion of a wall of said solder pot, and movable between a first position enlarging the volume of the solder pot and a second position decreasing the volume of the solder pot;
means for moving the plunger between the first position and the second position; and
means for positioning a work piece to be contacted by molten solder in a preselected position over the open aperture comprising:
a holder for a printed circuit board having an array of component locations thereon;
a hinge member connected to the printed circuit board holder,
a horizontal track on the base of the machine;
a carriage;
means for mounting the carriage on the track for motion along the length thereof;
the carriage including a horizontal bar extending in a direction transverse to the direction of extent of the track; and means for mounting the hinge member on the transverse bar of the carriage for (a) motion along the length of the bar, and (b) pivotal movement of the hinge member about the bar for selectively raising and lowering the circuit board holder.

4. A solder machine as defined in claim 3 further comprising:

a template mounted on the base;

an array of position indicia on the template corresponding to the array of component locations on the printed circuit board;

a position indicia engaging member on the circuit board holder.

5. A solder machine as defined in claim 4 further comprising:

means for sensing when the indicia engaging member is in engagement with an indicium; and means for actuating the means for moving the plunger when engagement is sensed.

6. A solder machine as defined in claim 5 wherein the indicia on the template include a recessed portion; and the indicia engaging member on the holder includes an extending member lowerable into the recessed portion, and further comprising a switch actuated by lowering of the holder; and wherein the means for moving the plunger is responsive to the switch.

7. A solder machine as defined in claim 5 wherein the solder pot includes an open ended tube extending through an upper wall of the solder pot; and wherein the plunger comprises a buoyant piston mounted in the cylinder.

8. A solder machine as defined in claim 7 further comprising:

a solder overflow collection channel adjacent the open aperture;

an orifice between the overflow channel and the interior of the solder pot; and wherein the piston blocks the aperture when in the second position and opens the aperture when in the first position.

9. A solder machine comprising:

a base;

a solder pot mounted on the base, the solder pot including an upwardly facing open aperture, and an open ended tube extending through the upper wall of the solder pot;

means for maintaining solder in the solder pot in a molten state;

a buoyant piston mounted in the tube defining at least a portion of a wall of said solder pot, and movable between a first position enlarging the volume of the solder pot and a second position decreasing the volume of the solder pot;

means for moving the plunger between the first position and the second position;

means for positioning a work piece to be contacted by molten solder in a preselected position over the open aperture;

a solder overflow collection channel adjacent the open aperture; and an orifice between the overflow channel and the interior of the solder pot; and wherein the piston blocks the aperture when in the second position and opens the aperture when in the first position.

10. A solder machine as defined in claim 1 wherein the means for automatically actuating comprises:

a work piece holder;

a template mounted on the base;

an array of position indicia on the template corresponding to selected locations on a work piece;

a position indicium engaging member on the work piece holder;

means for sensing when the indicium engaging member is in an engagement with an indicium; and means for actuating the means for moving the plunger when engagement is sensed.

* * * * *